(12) United States Patent
Huang et al.

(10) Patent No.: US 10,063,223 B1
(45) Date of Patent: Aug. 28, 2018

(54) AUDIO SWITCH CIRCUIT FOR REDUCING ON-RESISTANCE VARIATION

(71) Applicant: SEMICONDUCTOR COMPONENTS INDUSTRIES, LLC, Phoenix, AZ (US)

(72) Inventors: Lei Huang, Sunnyvale, CA (US); Na Meng, Beijing (CN)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 15/803,906

(22) Filed: Nov. 6, 2017

(51) Int. Cl.
*H03K 17/06* (2006.01)

(52) U.S. Cl.
CPC .................. *H03K 17/063* (2013.01)

(58) Field of Classification Search
CPC ........ H01L 2924/13091; H03K 17/687; H03K 17/063; H03K 19/018521; H03K 17/08122; H03K 17/165; H03K 2017/066; H03K 17/08; H03K 17/6872; H03K 17/693; H03K 2217/0027; H04R 1/1041
See application file for complete search history.

(56) References Cited

U.S. PATENT DOCUMENTS

| 7,782,117 | B2 | 8/2010 | Stultz et al. | |
| 9,413,231 | B2 | 8/2016 | Huang | |
| 2006/0284607 | A1* | 12/2006 | Isobe | H02M 3/156 323/282 |
| 2008/0094044 | A1* | 4/2008 | Ji | G05F 1/575 323/268 |
| 2009/0128217 | A1* | 5/2009 | Kinsella | H03K 17/063 327/427 |
| 2011/0293100 | A1* | 12/2011 | Stultz | H03F 1/52 381/28 |
| 2012/0126878 | A1* | 5/2012 | Gagne | H03K 17/145 327/378 |

\* cited by examiner

*Primary Examiner* — Mohammad Islam
(74) *Attorney, Agent, or Firm* — Brake Hughes Bellermann LLP

(57) ABSTRACT

According to an implementation, an audio switch circuit includes an audio switch configured to selectively couple an input node to an output node to transfer an audio signal across the audio switch. The audio switch has an on-resistance in response to the input node being coupled to the output node. The on-resistance of the audio switch changes by a first value in response to an input voltage of the audio signal increasing from a first level to a second level. The audio switch circuit includes an on-resistance compensation circuit configured to have an on-resistance that changes by a second value in response to the input voltage of the audio signal increasing from the first level to the second level. The on-resistance compensation circuit is coupled to the audio switch such that the second value at least partially offsets the first value.

20 Claims, 8 Drawing Sheets

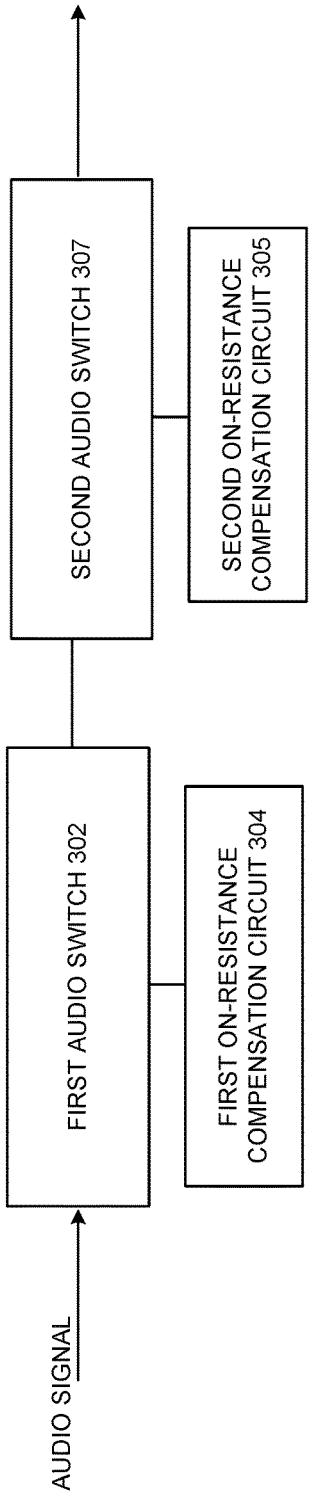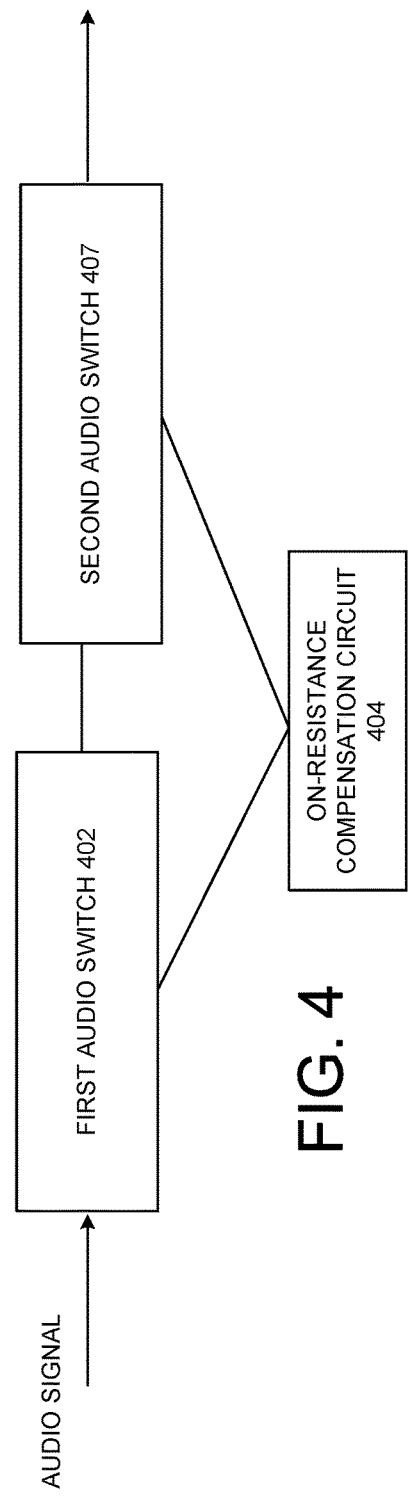

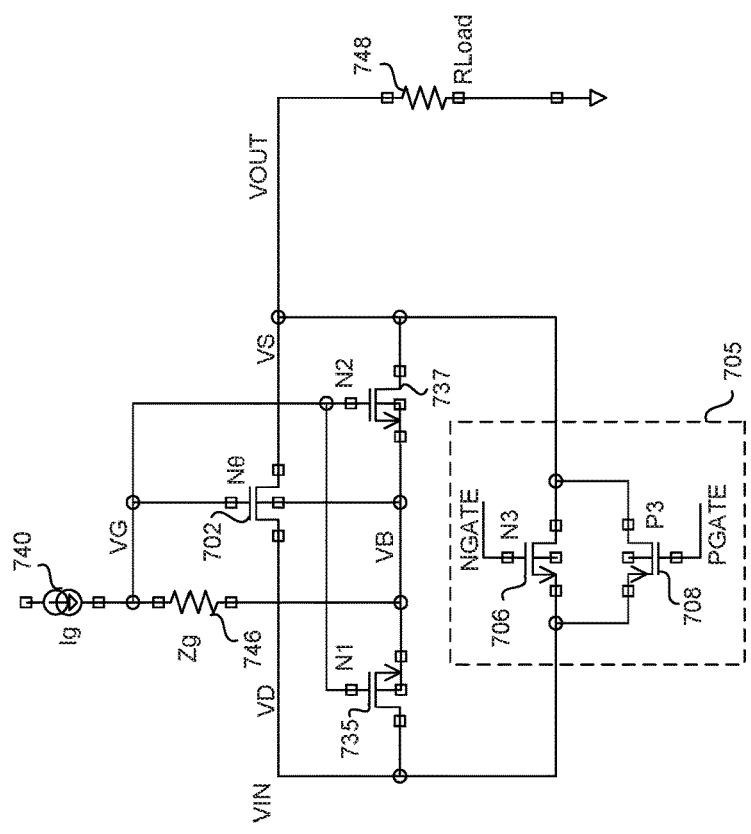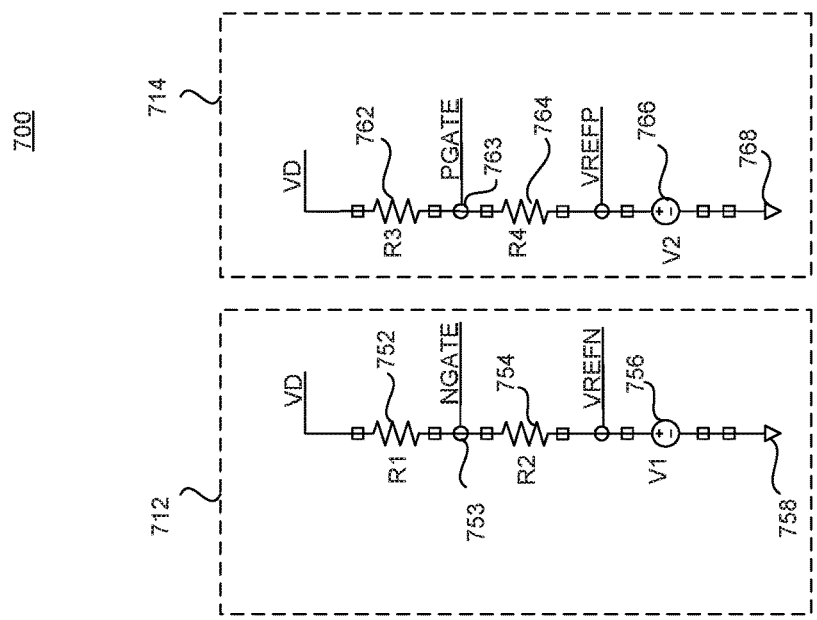
FIG. 7

United States Patent

US 10,063,223 B1

AUDIO SWITCH CIRCUIT FOR REDUCING ON-RESISTANCE VARIATION

TECHNICAL FIELD

This description relates to audio switch circuits for reducing on-resistance variation.

BACKGROUND

A switch may be used to selectively transfer an input signal. However, the switch inherently adds on-resistance (also referred to as Ron) to the transfer path. For example, in an ideal world, the switch would have zero impedance when the switch is in an on-state (e.g., transferring the input signal across the switch). In reality, there are one or more components in the switch that inherently have some electrical resistance which prevent the switch from performing with no impedance. The combined effect of all the resistive components may be referred to as the on-resistance.

SUMMARY

According to an implementation, an audio switch circuit includes an audio switch configured to selectively couple an input node to an output node to transfer an audio signal across the audio switch. The audio switch has an on-resistance in response to the input node being coupled to the output node. The on-resistance of the audio switch changes by a first value in response to an input voltage of the audio signal increasing from a first level to a second level. The audio switch circuit includes an on-resistance compensation circuit configured to have an on-resistance that changes by a second value in response to the input voltage of the audio signal increasing from the first level to the second level. The on-resistance compensation circuit is coupled to the audio switch such that the second value at least partially offsets the first value.

According to some implementations, the audio switch circuit may include one or more of the following features (or any combination thereof). The on-resistance compensation circuit may be coupled in parallel with the audio switch. The on-resistance compensation circuit may be coupled in series with the audio switch. The first value may be positive and the second value may be negative. The on-resistance compensation circuit may include a complementary metal-oxide-semiconductor (CMOS) switch, where the CMOS switch includes a first transistor in parallel with a second transistor. The on-resistance compensation circuit may include a first gate voltage generator coupled to a gate of the first transistor, and a second gate voltage generator coupled to a gate of the second transistor. The first gate voltage generator may include a first resistor, a second resistor, and a bias voltage source.

According to an implementation, an audio switch circuit includes an audio switch configured to selectively couple an input node to an output node to transfer an audio signal across the audio switch. The audio switch has an on-resistance in response to the input node being coupled to the output node. The on-resistance of the audio switch increases in response to an input voltage of the audio signal increasing from a first level to a second level. The audio switch circuit includes a complementary metal-oxide-semiconductor (CMOS) switch coupled to the audio switch. The CMOS switch is configured to have an on-resistance that decreases in response to the input voltage increasing from the first level to the second level. The CMOS switch is coupled to the audio switch such that the increasing of the on-resistance of the audio switch is at least partially offset by the decreasing of the on-resistance of the CMOS switch.

In some implementations, the audio switch circuit includes any one or more of the above/below features (or any combination thereof). The CMOS switch may be coupled in parallel with the audio switch. The CMOS switch may be coupled in series with the audio switch. The audio switch may be a first audio switch, and the CMOS switch may be a first CMOS switch, and the audio switch circuit may include a second audio switch, and a second CMOS switch coupled to the second audio switch, where the second CMOS switch is configured to compensate a changing of an on-resistance of the second audio switch. The CMOS switch may include a P-channel transistor in parallel with an N-channel transistor. The audio switch circuit may include a first gate voltage generator coupled to a gate of the P-channel transistor. The first gate voltage generator may be configured to generate a first gate voltage based on the input voltage of the audio signal. The audio switch circuit may include a second gate voltage generator coupled to a gate of the P-channel transistor. The second gate voltage generator may be configured to generate a second gate voltage based on the input voltage of the audio signal. The first gate voltage generator may include a voltage divider and a bias voltage source. The second gate voltage generator may include a voltage divider and a bias voltage source.

According to an implementation, an audio switch circuit includes a first audio switch, a second audio switch, and an on-resistance compensation circuit coupled to at least one of the first audio switch or the second audio switch. The on-resistance compensation circuit is configured to compensate a changing of an on-resistance of least one of the first audio switch or the second audio switch in response to an input voltage of an audio signal changing from a first level to a second level.

In some implementations, the audio switch circuit includes any one or more of the above/below features (or any combination thereof). The on-resistance compensation circuit may be coupled to the first audio switch and the second audio switch. The on-resistance compensation circuit may be coupled in parallel to the first audio switch, and the on-resistance compensation circuit may be coupled in parallel to the second audio switch. The on-resistance compensation circuit may be a first on-resistance compensation circuit, where the first on-resistance compensation circuit is coupled to the first audio switch. The audio switch circuit may include a second on-resistance compensation circuit coupled to the second audio switch. The on-resistance compensation circuit may include a complementary metal-oxide-semiconductor (CMOS) switch, where the CMOS switch includes a first transistor in parallel with a second transistor. The on-resistance compensation circuit may include a first gate voltage generator coupled to a gate of the first transistor, and a second gate voltage generator coupled to a gate of the second transistor.

The details of one or more implementations are set forth in the accompanying drawings and the description below. Other features will be apparent from the description and drawings, and from the claims.

BRIEF DESCRIPTION OF THE DRAWINGS

FIG. 3 illustrates an audio switch circuit for reducing on-resistance variation according to another implementation.

FIG. 4 illustrates an audio switch circuit for reducing on-resistance variation according to another implementation.

FIG. 7 illustrates an audio switch circuit for reducing on-resistance variation according to another implementation.

DETAILED DESCRIPTION

This disclosure relates to an audio circuit having an on-resistance compensation circuit that compensates on-resistance variation of an audio switch when an input voltage of an audio signal changes.

For example, the fidelity of a transferred audio signal may be negatively affected if the audio switch's on-resistance changes with the changing of the input voltage. Variations of the on-resistance with respect to the changing of the input voltage may be referred to as Rflatness. Rflatness is the difference between the lowest and highest on-resistance over the input voltage range of the audio switch. One measure of the audio fidelity is total harmonic distortion (THD), which is introduced by the audio switch. Keeping a switch's on-resistance relatively constant despite input signal voltage variations may improve the THD. The on-resistance of a metal-oxide-semiconductor-field-effect transistor (MOS-FET) may be a function of the gate to source voltage (VGS). Since the on-resistance is a function of VGS, under some conditions, the on-resistance may be relatively constant if VGS is constant. Even if the VGS is relatively constant, for relatively heavy load conditions, the voltage difference on the source and the drain of the switch (VDS) is greater than the VDS for light load conditions, which can cause on-resistance variations. For example, audio switch applications having relatively stringent THD requirements and/or higher voltage tolerance (surge) on the signal pins may experience on-resistance variations that negatively impact THD.

However, the on-resistance compensation circuit compensates the on-resistance variation of the audio switch when the input voltage changes in order to reduce Rflatness and improve THD. For example, when the audio switch is closed and the input voltage increases, the switch's on-resistance changes by a positive value. The on-resistance compensation circuit is configured to have an on-resistance that changes by a negative value when the input voltage increases such that the positive change of the on-resistance introduced by the audio switch is compensated (e.g., at least partially) by the negative change of the on-resistance introduced by the on-resistance compensation circuit. As such, the Rflatness of the on-resistance can be improved, thereby improving THD. In some examples, the on-resistance compensation circuit includes a complementary metal-oxide-semiconductor (CMOS) switch that is coupled to the audio switch. In some examples, the on-resistance compensation circuit is coupled in parallel with the audio switch. In some examples, the on-resistance compensation circuit is coupled in series with the audio switch.

Figure 1A:
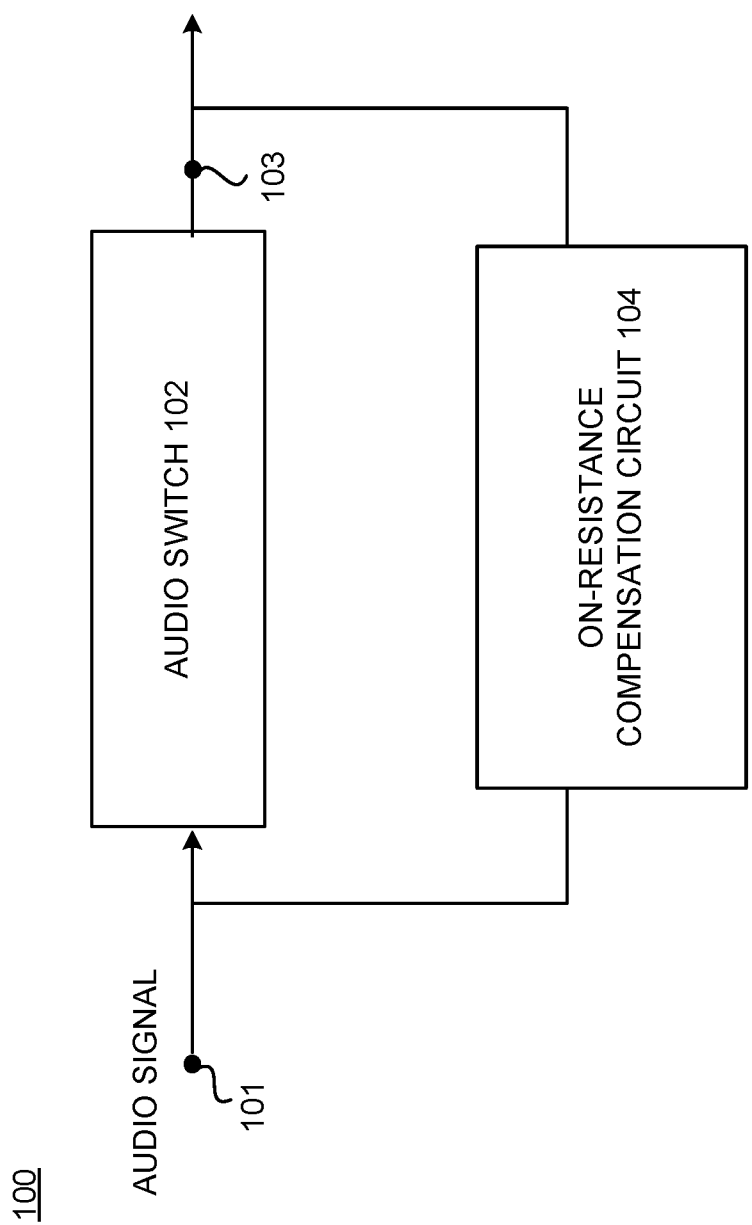
FIG. 1A illustrates an audio switch circuit having an on-resistance compensation circuit coupled in parallel with an audio switch according to an implementation.
Figure 1B:
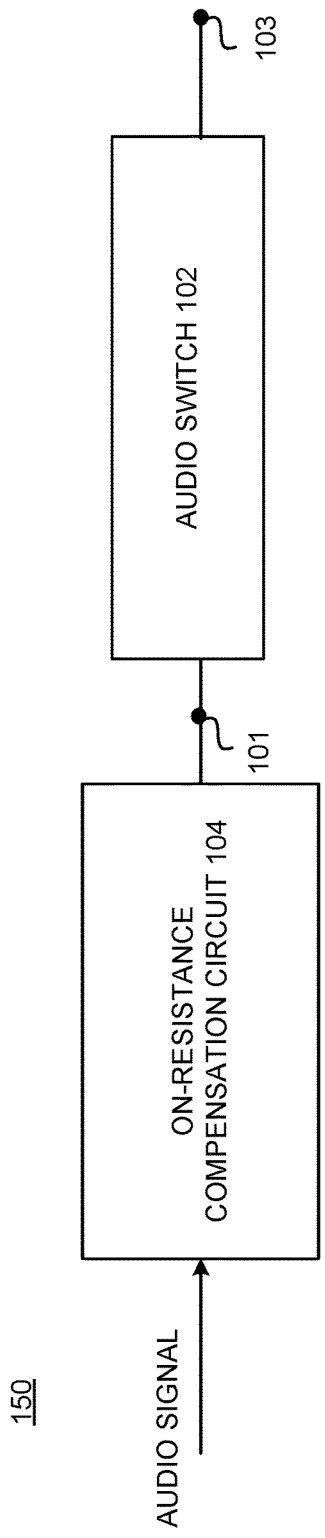
FIG. 1B illustrates an audio switch circuit having an on-resistance compensation circuit coupled in series with an audio switch according to an implementation.
Figure 1C:
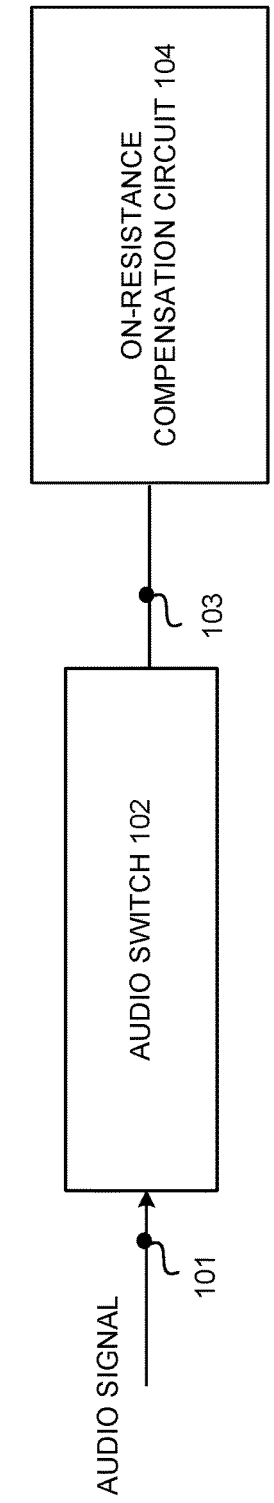
FIG. 1C illustrates an audio switch circuit having an on-resistance compensation circuit coupled in series with an audio switch according to another implementation.

FIGS. 1A-1C illustrate an on-resistance compensation circuit 104 configured to compensate a changing of the on-resistance (also referred to as Ron) of an audio switch 102 when an input voltage of an audio signal changes in order to reduce Rflatness and improve THD according to implementations. For example, the audio switch 102 is configured to selectively couple an input node 101 to an output node 103 to transfer the audio signal across the audio switch 102. When the audio switch 102 is closed (or in an on-state), the input node 101 is coupled to the output node 103, and the audio signal is transferred from the input node 101 to the output node 103 (across the audio switch 102). When the audio switch 102 is open (or in an off-state), the input node 101 is not coupled to the output node 103, and the audio signal is not transferred across the audio switch 102. When the audio switch 102 is closed, the audio switch 102 has an on-resistance, and the on-resistance of the audio switch 102 changes by a positive value when the input voltage increases. The on-resistance compensation circuit 104 is configured to have an on-resistance that changes by a negative value when the input voltage increases such that the positive change of the on-resistance introduced by the audio switch 102 is offset by the negative change of the on-resistance introduced by the on-resistance compensation circuit 104. In some examples, the switch's on-resistance variation is partially offset by the circuit's on-resistance variation. In some examples, the switch's on-resistance variation is fully offset by the circuit's on-resistance variation. As a result, the Rflatness of the overall on-resistance can be improved (e.g., the overall on-resistance being a combination of the on-resistance of the audio switch 102 and the on-resistance of on-resistance compensation circuit 104).

In some examples, the on-resistance compensation circuit 104 is coupled in parallel with the audio switch 102. FIG. 1A illustrates an audio switch circuit 100 in which the on-resistance compensation circuit 104 is coupled in parallel with the audio switch 102. In some examples, the on-resistance compensation circuit 104 is coupled in series with the audio switch 102. FIG. 1B illustrates an audio switch circuit 150 in which the on-resistance compensation circuit 104 is coupled in series with the audio switch 102. For example, in FIG. 1B, the on-resistance compensation circuit 104 is coupled to an input of the audio switch 102. FIG. 1C illustrates an audio switch circuit 180 in which the on-resistance compensation circuit 104 is coupled in series with the audio switch 102. For example, in FIG. 1C, the on-resistance compensation circuit 104 is coupled to an output of the audio switch 102.

The audio switch circuits discussed herein may be used in a wide variety of audio applications and analog switch products. In some examples, the audio switch circuits may be incorporated into a Universal Serial Bus (USB) audio interface. In some examples, the audio switch 102 is an analog audio switch. In some examples, the audio switch 102 is a field-effect transistor (FET). In some examples, the audio switch 102 is metal-oxide-semiconductor field-effect transistor (MOSFET). In some examples, the audio switch 102 is an N-channel MOSFET.

As indicated above, the fidelity of the transferred audio signal may be negatively affected when the on-resistance of the audio switch 102 changes with the changing of the input voltage of the audio signal. For example, the on-resistance of the audio switch 102 may change by a first value when the input voltage increases from a first level to a second level (e.g., the on-resistance may increase by X amount when the input voltage of the audio signal increases by Y amount). The first level may be a voltage level that causes the audio switch 102 to close (or be within the on-state). The second level may be a voltage level higher than the first level. The on-resistance of the audio switch 102 may change by a second value when the input voltage of the audio signal changes from the second level to a third level. The third level may be a voltage level higher than the second level. In some examples, the on-resistance of the audio switch 102 may increase linearly (e.g., the second value being the same (or substantially the same) as the first value). In other examples, the on-resistance of the audio switch 102 may increase non-linearly (e.g., the second value being larger or smaller than the first value).

As indicated above, one measure of the audio fidelity is total harmonic distortion (THD) that is introduced by the audio switch 102. Keeping the on-resistance of the audio switch 102 relatively constant (e.g., unchanging) despite input signal voltage variations may improve the THD. In some examples, the on-resistance of the on-resistance compensation circuit 104 changes by a third value when the input voltage increases from the first level to the second level such that the changing of the on-resistance of the audio switch 102 (by the first value) is offset by the changing of the on-resistance of the on-resistance compensation circuit 104 (by the third value), to reduce Rflatness or provide a relatively constant overall on-resistance. In some examples, the third value has a magnitude that is the same (or substantially the same) as the first value, but the first value and the third value have opposite polarities. For example, the first value is a positive, and the third value is a negative, but the absolute values of the first and third values are the same (or substantially the same). In some examples, the first value is a positive value, and the third value is a negative value, and the third value is different from the first value.

When the input voltage transitions from the first level to the second level, the positive change of the on-resistance of the audio switch 102 is combined with the negative change of the on-resistance of the on-resistance compensation circuit 104 to reduce Rflatness and/or provide a relatively constant overall on-resistance. When the input voltage increases from the second level to the third level, the on-resistance of the on-resistance compensation circuit 104 changes by a fourth value to offset the changing of the on-resistance of the audio switch 102 by the second value. In some examples, the fourth value has a magnitude that is the same (or substantially the same) as the second value, but the second value and the fourth value have opposite polarities. In some examples, the second value is positive, and the fourth value is negative, and the fourth value is different from the second value. When the input voltage transitions from the second level to the third level, the positive change of the on-resistance of the audio switch 102 is combined with the negative change of the on-resistance of the on-resistance compensation circuit 104 to reduce Rflatness and/or provide a relatively constant overall on-resistance. The same operations apply when input voltage increases from the third level to a fourth level, a fifth level, etc. (or when the input voltage transitions back to the second level and the first level). Since the variations of the on-resistance are minimized as the input voltage changes over the input voltage range of the audio switch 102, THD can be improved.

Figure 2:
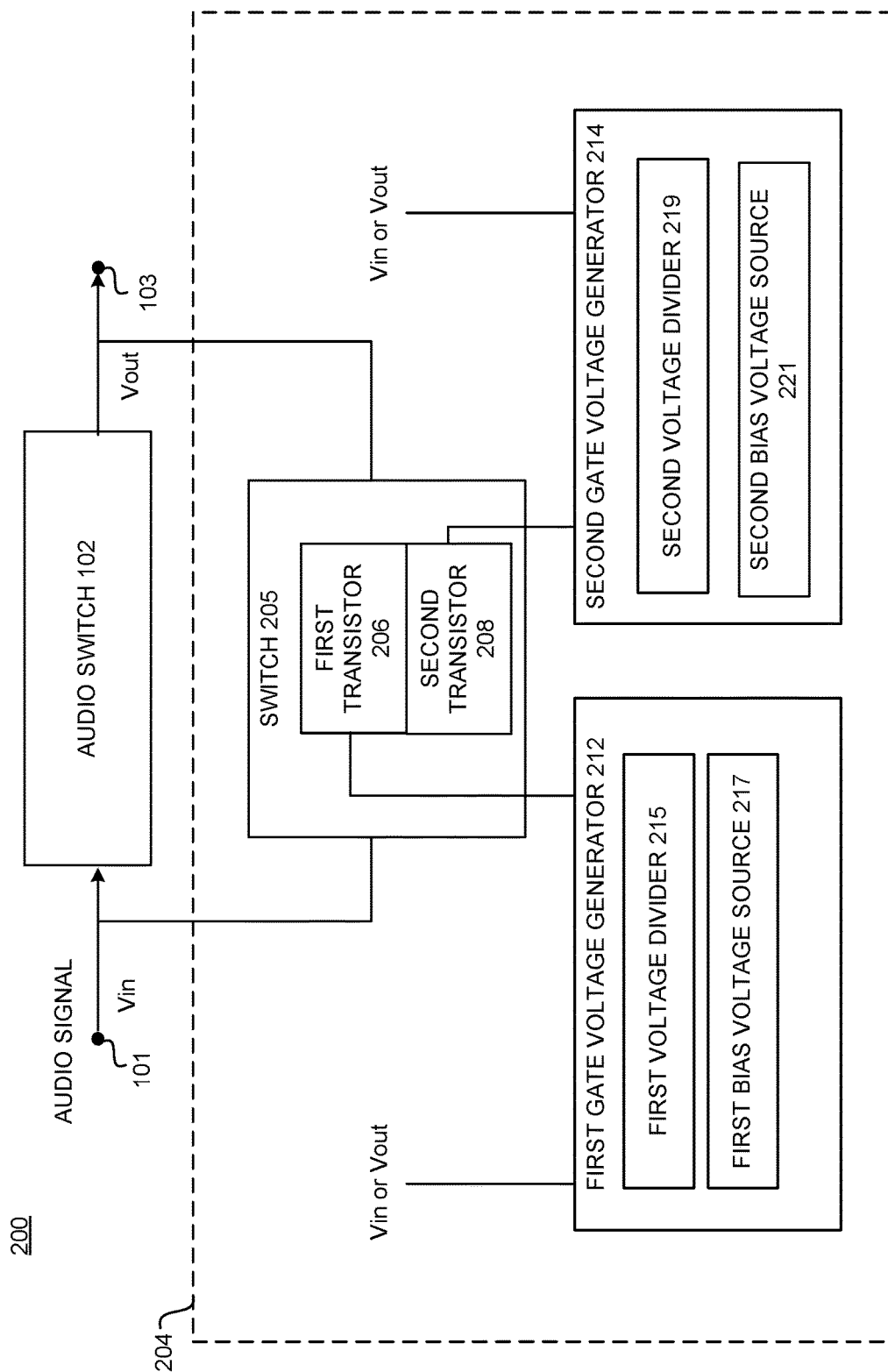
FIG. 2 illustrates an audio switch circuit for reducing on-resistance variation according to an implementation.

FIG. 2 illustrates an audio switch circuit 200 for reducing on-resistance variation according to an implementation. The audio switch circuit 200 includes the audio switch 102 for selectively coupling the input node 101 to the output node 103 to transfer the audio signal across the audio switch 102. The audio switch circuit 100 may include an on-resistance compensation circuit 204 coupled to the audio switch 102. The on-resistance compensation circuit 204 may include any one or more of the features described with respect to the on-resistance compensation circuit 104 of FIG. 1 (and/or the on-resistance compensation circuit of FIGS. 3-7).

The on-resistance compensation circuit 204 includes a switch 205 coupled to the audio switch 102. In some examples, the switch 205 includes one or more transistors configured as a switching device. In some examples, the switch 205 is a complementary metal-oxide-semiconductor (CMOS) switch. As shown in FIG. 2, the switch 205 is coupled in parallel to the audio switch 102. In other examples, the switch 205 is coupled in series to the audio switch 102 (as shown in FIG. 1B or 1C). The switch 205 may include a first transistor 206 in parallel with a second transistor 208. The first transistor 206 may be an N-channel transistor. The second transistor 208 may be a P-channel transistor.

The on-resistance compensation circuit 204 further includes a first gate voltage generator 212 coupled to a gate of the first transistor 206, and a second gate voltage generator 214 coupled to a gate of the second transistor 208. The first gate voltage generator 212 is configured to generate a first gate voltage (also referred to as NGATE voltage) to activate (turn-on or close) or de-activate (turn-off or open) the first transistor 206. The first gate voltage generator 212 may include a first voltage divider 215 and a first bias voltage source 217. In some examples, the first voltage divider 215 may include at least two resistors (e.g., resistor 652 and resistor 654 of FIG. 6). The first bias voltage source 217 provides a bias voltage that is used to bias the first gate voltage relative to the input voltage (or the output voltage if the output voltage is used to generate the first gate voltage).

The first gate voltage generator 212 may receive the input voltage and generate the first gate voltage using the first voltage divider 215 and the first bias voltage source 217. In some examples, since the input voltage is substantially equal when the audio switch 102 is closed, the first gate voltage generator 212 may receive the output voltage and generate the first gate voltage using the first voltage divider 215 and the first bias voltage source 217. The first gate voltage may determine the timing of when the first transistor 206 activates and deactivates, which affects the timing of when the offset on-resistance variation introduced by the switch 205 is combined with the on-resistance variation introduced by the audio switch 102. By adjusting the values of the first voltage divider 215 and the level of voltage provided by the first bias voltage source 217, the timing of when the first transistor 206 activates and deactivates can be tuned or adjusted to suit particular types of switches and/or audio applications.

The second gate voltage generator 214 is configured to generate a second gate voltage (also referred to as PGATE voltage) to activate and deactivate the second transistor 208. The second gate voltage generator 214 may include a second voltage divider 219 and a second bias voltage source 221. In some examples, the second voltage divider 219 may include at least two resistors (e.g., resistor 662 and resistor 664 of FIG. 6). The second bias voltage source 221 provides a bias voltage that is used to bias the second gate voltage relative to the input voltage (or the output voltage if the output voltage is used to generate the second gate voltage).

The second gate voltage generator 214 may receive the input voltage and generate the second gate voltage using the second voltage divider 219 and the second bias voltage source 221. In some examples, since the input voltage is substantially equal when the audio switch 102 is closed, the second gate voltage generator 214 may receive the output voltage and generate the second gate voltage using the second voltage divider 219 and the second bias voltage source 221. The second gate voltage may determine the timing of when the second transistor 208 activates and deactivates, which affects the timing of when the offset on-resistance variation introduced by the switch 205 is combined with the on-resistance variation introduced by the audio switch 102. By adjusting the values of the second voltage divider 219 and the level of voltage provided by the second bias voltage source 221, the timing of when the second transistor 208 activates and deactivates can be tuned or adjusted to suit particular types of switches and/or audio applications.

When the input voltage is greater than zero, the second transistor 208 (e.g., the P-channel transistor) is activated, where the exact timing of the activation of the second transistor 208 in relation to the input voltage is determined by the second gate voltage generator 214. As the input voltage increases, the gate to source voltage (VGS) increases and the on-resistance of the second transistor 208 decreases (e.g., the changing of the on-resistance has a negative coefficient). When the input voltage is less than zero, the first transistor 206 (e.g., the N-channel transistor) is activated, where the exact timing of the activation of the first transistor 206 in relation to the input voltage is determined by the first gate voltage generator 212. When the magnitude of the input voltage increases (e.g., getting more negative), the magnitude of the VGS of the first transistor 206 increases, and the on-resistance of the first transistor 206 decreases (e.g., the changing of the on-resistance has a negative coefficient).

Since the switch 205 is coupled in parallel to the audio switch 102, the on-resistance is the on-resistance of the switch 205 in parallel with the on-resistance of the audio switch 102, which causes the positive derivative (e.g., positive change) of the audio switch's on-resistance to be compensated by the negative derivative (e.g., negative change) of the CMOS switch's on-resistance as the input voltage increases, which can reduce Rflatness and/or provide a relatively constant on-resistance.

FIG. 3 illustrates an audio switch circuit 300 for reducing on-resistance variation according to an implementation. The audio switch circuit 300 includes a first audio switch 302 coupled in series with a second audio switch 307. The first audio switch 302 and the second audio switch 307 may include any of the features with respect to the audio switch 102 as described with reference to FIGS. 1-2. The first audio switch 302 may be associated with a first stage, and the second audio switch 307 may be associated with a second stage. Since the audio switch circuit 300 has at least two stages, the audio switch circuit 300 may have a relatively higher voltage tolerance than single stage audio circuits. In some examples, the audio switch circuit 300 may include more than two stages (e.g., 3, 4, or 5 stages, each with a separate audio switch).

As shown in FIG. 3, a first on-resistance compensation circuit 304 is coupled to the first audio switch 302, and a second on-resistance compensation circuit 305 is coupled to the second audio switch 307. The first on-resistance compensation circuit 304 is configured to compensate the on-resistance variation of the first audio switch 302 when the input voltage changes. The second on-resistance compensation circuit 305 is configured to compensate the on-resistance variation of the second audio switch 307. The first on-resistance compensation circuit 304 and the second on-resistance compensation circuit 305 may be any of the on-resistance compensation circuits discussed herein. In some examples, the first on-resistance compensation circuit 304 is coupled in parallel with the first audio switch 302, and the second on-resistance compensation circuit 305 is coupled in parallel with the second audio switch 307. In some examples, the first on-resistance compensation circuit 304 is coupled in series with the first audio switch 302, and the second on-resistance compensation circuit 305 is coupled in parallel with the second audio switch 307 (or vice versa).

FIG. 4 illustrates an audio switch circuit 400 for reducing on-resistance variation according to an implementation. The audio switch circuit 400 includes a first audio switch 402 coupled in series with a second audio switch 407. The first audio switch 402 and the second audio switch 407 may include any of the features with respect to the audio switch 102 as described with reference to FIGS. 1-2. The first audio switch 402 may be associated with a first stage, and the second audio switch 407 may be associated with a second stage. In some examples, the audio switch circuit 400 may include more than two stages (e.g., 3, 4, or 5 stages, each with a separate audio switch).

As shown in FIG. 4, a single on-resistance compensation circuit is used to compensate the on-resistance variation of two audio switches. In some examples, a single on-resistance compensation circuit is used to compensate the on-resistance variation of more than two audio switches (e.g., 3, 4, or 5 audio switches). As shown in FIG. 4, an on-resistance compensation circuit 404 is coupled to the first audio switch 402 and the second audio switch 407. The on-resistance compensation circuit 404 is configured to compensate the on-resistance variation of the first audio switch 402 and the on-resistance variation of the second audio switch 407 when the input voltage changes. The on-resistance compensation circuit 404 may be any of the on-resistance compensation circuits discussed herein. In some examples, the on-resistance compensation circuit 404 is coupled in parallel with the first audio switch 402, and coupled in parallel with the second audio switch 407. In some examples, the on-resistance compensation circuit 404 is coupled in series with the first audio switch 402 and the second audio switch 407.

Figure 5:
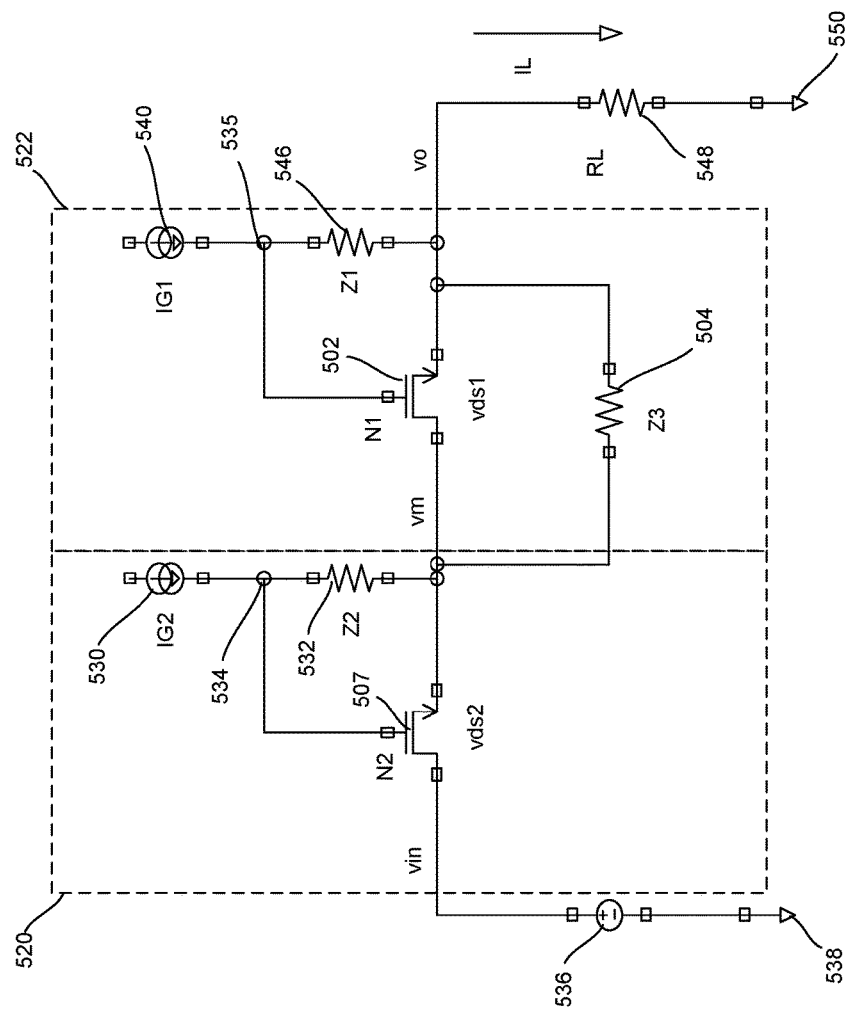
FIG. 5 illustrates an audio switch circuit for reducing on-resistance variation according to another implementation.

FIG. 5 illustrates an audio switch circuit 500 for reducing on-resistance variation according to an implementation. The audio switch circuit 500 includes a first stage 520 and a second stage 522. The first stage 520 includes an audio switch 507, a first current source 530, and a first biasing circuit 532 that biases the gate of the audio switch 507. The audio switch 507 receives an input voltage (Vin) of an audio signal from a voltage source 536, and transfers the audio signal across the audio switch 507 when the audio switch 507 is closed. As shown in FIG. 5, the voltage source 536 is coupled to a ground 538. In some examples, the audio switch 507 is a MOSFET (e.g., an N-channel MOSFET). The drain of the audio switch 507 is coupled to the voltage source 536, the gate of the audio switch 507 is coupled to a node 534 between the first current source 530 and the first biasing circuit 532, and the source of the audio switch 507 is coupled to the drain of an audio switch 502. The audio switch 502 may be referred to as a first audio switch, and the audio switch 507 may be referred to as a second audio switch.

The second stage 522 includes the audio switch 502, an on-resistance compensation circuit 504 coupled in parallel to the audio switch 502, a second current source 540, and a second biasing circuit 546 that biases the gate of the audio switch 502. The audio switch 502 receives voltage (vm) from the audio switch 507, where the voltage (vm) is substantially equal to the voltage (vin) (when the audio switch 507 is closed), and transfers the audio signal across the audio switch 502 when the audio switch 502 is closed. In some examples, the audio switch 502 is a MOSFET (e.g., an N-channel MOSFET). The drain of the audio switch 502 is coupled to the source of the audio switch 507, the gate of the audio switch 502 is coupled to a node 535 between the second current source 540 and the second biasing circuit 546, and the source of the audio switch 502 is coupled to a load 548. The load 548 is also coupled to a ground 550. Also, in some examples, a secondary on-resistance compensation circuit can be coupled in parallel to the audio switch 507 to compensate for the on-resistance variation of the audio switch 507 (e.g., shown in FIG. 3). In other examples, the secondary on-resistance compensation circuit may be coupled in parallel to both the audio switch 507 and the audio switch 502 (e.g., as shown in FIG. 4).

The on-resistance compensation circuit 504 is configured to compensate for the on-resistance variation of the audio switch 502 by adding a negative variation of its on-resistance to offset the positive variation of the on-resistance introduced by the audio switch 502 when the voltage (vm) changes. For example, the changing of the on-resistance of the on-resistance compensation circuit 504 offsets (or compensates) the changing of the on-resistance of the audio switch 502, thereby reducing Rflatness or providing a constant (or substantially constant) overall on-resistance (e.g., the overall on-resistance being the on-resistance of the audio switch 502 in parallel with the on-resistance of the on-resistance compensation circuit 504).

The operation in the active region can be assumed to be ($V_{DS} < V_{GS} - V_T$) and $V_{DS}$ is small, where:

$$i_D = \frac{\mu C_{OX} W}{L}\left[(V_{GS} - V_T) - \frac{V_{DS}}{2}\right]V_{DS} \approx \frac{\mu C_{OX} W}{L}(V_{GS} - V_T)V_{DS} \quad \text{Eq. (1)}$$

Therefore, the on-resistance can be expressed as:

$$R_{ON} \approx \frac{V_{DS}}{i_D} = \frac{1}{\frac{\mu C_{OX} W}{L}(V_{GS} - V_T)} \quad \text{Eq. (2)}$$

Based on Eq. (2), the on-resistance of the audio switch 502 can be expressed as:

$$R_1 = R_{1,0} + a_1 * vo, \quad \text{Eq. (3):}$$

where $R_1$ is the on-resistance of the audio switch 502.

Based on Eq. (2), the on-resistance of the audio switch 507 can be expressed as:

$$R_2 = R_{2,0} + a_2 * vo, \quad \text{Eq. (4):}$$

where $R_2$ is the on-resistance of the audio switch 507.

The on-resistance of the on-resistance compensation circuit 504 can be expressed as:

$$Z_3 = Z_0 - b_1 * vo, \quad \text{Eq. (5):}$$

where $Z_3$ is the on-resistance of the on-resistance compensation circuit 504.

Eqs. (3), (4), and (5) are expressed as a Taylor series function in terms of output voltage vo. However, it is noted that output voltage vo is substantially equal to input voltage vin and intermediate vm (when the switches are closed), and vin or vm may be used instead of vo in Eq. (3), Eq. (4), Eq. (5), Eq. (6), or Eq. (7). In Eq. (3), the component ($a_1 * vo$) represents the change (or derivative) of the on-resistance of the audio switch 502 from the previous state ($R_{1,0}$) when vo changes. In Eq. (4), the component ($a_2 * vo$) represents the change (or derivative) of the on-resistance of the audio switch 507 from the previous state ($R_{2,0}$) when vo changes. In Eq. (5), the component ($-b_1 * vo$) represents the negative change (or derivative) of the on-resistance of the on-resistance compensation circuit 504 from the previous state ($Z_0$) when the vo changes.

The on-resistance compensation circuit 504 is configured to provide the coefficient ($b_1$) from Eq. (5) to compensate for the coefficient ($a_1$) from Eq. (3). For example, the on-resistance compensation circuit 504 is configured to provide a negative $b_1$ coefficient for the component ($b_1 * vo$) as shown in Eq. (5) to offset the component ($a_1 * vo$) of the on-resistance of the audio switch 502 as shown in Eq. (3). In some examples, the on-resistance compensation circuit 504 includes a secondary on-resistance compensation circuit coupled in parallel to the audio switch 507 (e.g., as shown in FIG. 3). In this example, the on-resistance of the secondary on-resistance compensation circuit can be expressed as:

$$Z_4 = Z_0 - b_2 * vo \quad \text{Eq. (6):}$$

The secondary on-resistance compensation circuit is configured to provide the coefficient ($b_2$) from Eq. (6) to compensate for the coefficient ($a_2$) from Eq. (4). For example, the secondary on-resistance compensation circuit is configured to provide a negative $b_2$ coefficient for the component ($b_2 * vo$) in Eq. (6) to offset the component ($a_2 * vo$) of the on-resistance of the audio switch 507 in Eq. (4). In other examples, the on-resistance compensation circuit 504 is coupled in parallel to both the audio switch 507 and the audio switch 502. In this example, the on-resistance compensation circuit 504 may have a larger $b_1$ coefficient to compensative both coefficients $a_1$ and $a_2$.

As a result, the overall on-resistance may be relatively constant. For example, the overall on-resistance can be expressed as:

$$(Z_3 \| R_1) \approx (Z_0 \| R_{1,0}) + O(vo^2), \quad \text{Eq. (7):}$$

where $Z_3$ is the on-resistance of the on-resistance compensation circuit 504, and $R_1$ is the on-resistance of the audio switch 502.

As a result, the THD can be improved. THD plus noise can be expressed as:

$$THD + N = \frac{\sum_{n=2}^{\infty} \text{harmonics} + \text{noise}}{\text{fundamental}} \quad \text{Eq. (8)}$$

THD+N (noise) is a common distortion measurement for audio signals. In order to improve THD, the harmonics are reduced. Ideally, coefficients $a_1$, $a_2$ are zero (or close to zero) to achieve the best THD. For example, coefficient $a_1$, $a_2$ being zero or close to zero may reduce the harmonics in Eq. (8), thereby improving THD. Since the coefficients $a_1$, $a_2$ are offset by negative coefficients b1, b2 (thereby providing a zero value or close to zero value), the THD is improved.

Figure 6:
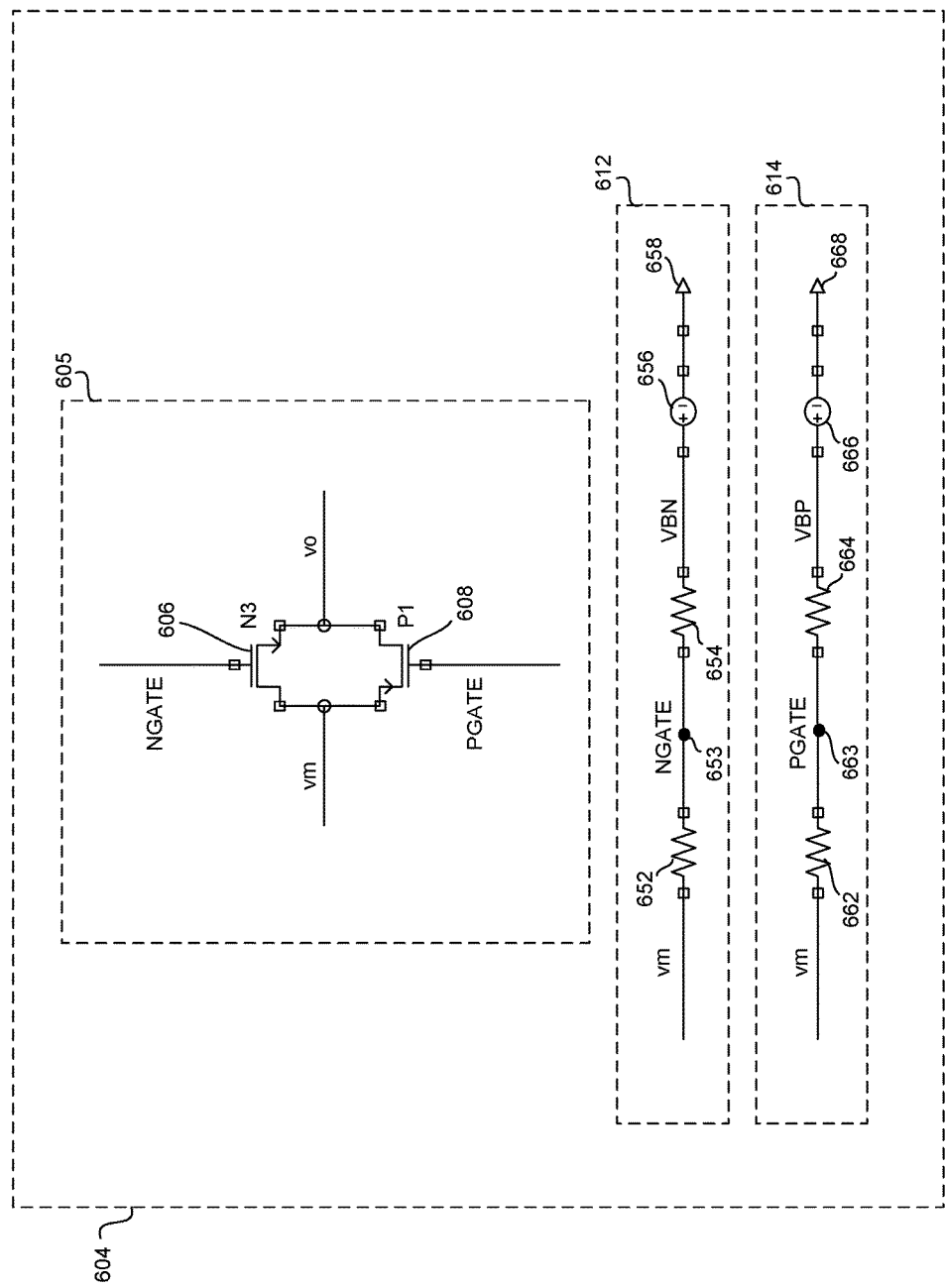
FIG. 6 illustrates an example of an on-resistance compensation circuit according to an implementation.

FIG. 6 illustrates an example of an on-resistance compensation circuit 604 according to an implementation. The on-resistance compensation circuit 604 includes a CMOS switch 605, an NGATE voltage generator 612, and a PGATE voltage generator 614. The CMOS switch 605 includes an N-channel transistor 606 arranged in parallel with a P-channel transistor 608. For example, the drain of the N-channel transistor 606 is coupled with the source of the P-channel transistor 608, and the source of the N-channel transistor 606 is coupled with the drain of the P-channel transistor 608. The voltage vm is connected to the drain of the N-channel transistor 606 and the source of the P-channel transistor 608, and the output voltage vo is coupled to the source of the N-channel transistor 606 and the drain of the P-channel transistor 608.

The NGATE voltage generator 612 is coupled to the gate of the N-channel transistor 606. The NGATE voltage generator 612 includes a resistor 652 and a resistor 654. The resistor 652 and the resistor 654, collectively, may be referred to as a first voltage divider (e.g., the first voltage divider 215 of FIG. 2). A node 653 is disposed between the resistor 652 and the resistor 654. The node 653 is coupled to the gate of the N-channel transistor 606. The resistor 652 is coupled to and receives the voltage vm. In some examples, since the voltage vm is substantially equal to the output voltage vo when the N-channel transistor 606 is closed, the resistor 652 may be coupled to and receive the output voltage vo. The NGATE voltage generator 612 includes a first bias voltage source 656 disposed between and coupled to the resistor 654 and a ground 658. The resistor 652, the node 653, the resistor 654, and the first bias voltage source 656 may be connected in series.

The PGATE voltage generator 614 is coupled to the gate of the P-channel transistor 608. The PGATE voltage generator 614 includes a resistor 662 and a resistor 664. The resistor 662 and the resistor 664, collectively, may be referred to as a second voltage divider (e.g., the second voltage divider 219 of FIG. 2). A node 663 is disposed between the resistor 662 and the resistor 664. The node 663 is coupled to the gate of the P-channel transistor 608. The resistor 662 is coupled to and receives the voltage vm. In some examples, since the voltage vm is substantially equal to the output voltage vo when the P-channel transistor 608 is closed, the resistor 662 may be coupled to and receive the output voltage vo. The PGATE voltage generator 614 includes a second bias voltage source 666 disposed between and coupled to the resistor 664 and a ground 668. The resistor 662, the node 663, the resistor 664, and the second bias voltage source 666 may be connected in series.

The NGATE voltage generator 612 is configured to generate the NGATE voltage to activate or deactivate the N-channel transistor 606. The NGATE voltage generator 612 may receive the voltage vm and generate the NGATE voltage using the resistor 652, the resistor 654, and the first bias voltage source 656. In some examples, since the input voltage is substantially equal when the audio switch 502 is closed, the NGATE voltage generator 612 may receive the output voltage vo and generate the NGATE voltage using the resistor 652, the resistor 654, and the first bias voltage source 656. The NGATE voltage may determine the timing of when the N-channel transistor 606 activates and deactivates, which affects the timing of when the offset on-resistance variation introduced by the CMOS switch 605 is combined with the on-resistance variation introduced by the audio switch 502. By adjusting the values of the resistor 652 and the resistor 654 and the level of voltage provided by the first bias voltage source 656, the timing of when the N-channel transistor 606 activates and deactivates can be tuned or adjusted to suit particular types of switches and/or audio applications.

The PGATE voltage generator 614 is configured to generate the PGATE voltage to activate or deactivate the P-channel transistor 608. The PGATE voltage generator 614 may receive the voltage vm and generate the PGATE voltage using the resistor 662, the resistor 664, and the second bias voltage source 666. In some examples, since voltage vm is substantially equal to the output voltage vo when the audio switch 502 is closed, the PGATE voltage generator 614 may receive the output voltage and generate the PGATE voltage using the resistor 662, the resistor 664, and the second bias voltage source 666. The PGATE voltage may determine the timing of when the P-channel transistor 608 activates and deactivates, which affects the timing of when the offset on-resistance variation introduced by the CMOS switch 605 is combined with the on-resistance variation introduced by the audio switch 502. By adjusting the values of the resistor 662, and the resistor 664, and the level of voltage provided by the second bias voltage source 666, the timing of when the P-channel transistor 608 activates and deactivates can be tuned or adjusted to suit particular types of switches and/or audio applications.

When the voltage vm is greater than zero, the P-channel transistor 608 is activated, the VGS of the P-channel transistor 608 increases and the on-resistance of the P-channel transistor 608 decreases (e.g., the changing of the on-resistance has a negative $b_1$ coefficient). When the voltage vm is less than zero, the N-channel transistor 606 is activated. When the magnitude of the voltage vm increases (e.g., getting more negative), the magnitude of the VGS of the N-channel transistor 606 increases, and the on-resistance of the N-channel transistor 606 decreases (e.g., the changing of the on-resistance has a negative $b_1$ coefficient). For example, referring to Eq. (2), the absolute value of |VGS|−|VT| is used. For the N-channel transistor 606, when the magnitude of the input voltage increases, the voltage VGS decreases, and therefore the on-resistance of the N-channel transistor 606 decreases. Similarly, for the P-channel transistor 608, when the input voltage increases, the voltage VGS decreases, and therefore the on-resistance of the P-channel transistor 608 decreases.

Since the CMOS switch 605 is coupled in parallel to the audio switch 502, the on-resistance is the on-resistance of the CMOS switch 605 in parallel with the on-resistance of the audio switch 502, which causes the positive derivative ($a_1$*vo)) of the audio switch's on-resistance to be compensated by the negative derivative (−$b_1$*vo) of the CMOS switch's on-resistance as the input voltage increases, which can reduce Rflatness and/or provide a relatively constant on-resistance.

FIG. 7 illustrates an audio switch circuit 700 for reducing on-resistance variation according to an implementation. The audio switch circuit 700 includes an audio switch 702, and a CMOS switch 705 coupled in parallel to the audio switch 702. When the audio switch 702 is closed, the audio switch 702 transfers an audio signal across the audio switch 702. The audio switch circuit 700 includes a switch 735 and a switch 737. In some examples, the switch 735 is an N-channel MOSFET. In some examples, the switch 737 is an N-channel MOSFET. The audio switch circuit 700 includes a current source 740 and biasing circuit 746 that biases the gate of the audio switch 702.

The CMOS switch 705 includes an N-channel transistor 706 coupled in parallel with a P-channel transistor 708. The audio switch circuit 700 includes an NGATE voltage generator 712, and a PGATE voltage generator 714. The NGATE voltage generator 712 includes a resistor 752, a resistor 754, a first bias voltage source 756, and a ground 758. The resistor 752 and the resistor 754 are configured as a first voltage divider (e.g., the first voltage divider 215 of FIG. 2). A node 753 is disposed between the resistor 752 and the resistor 754. The node 753 is coupled to the gate of the N-channel transistor 706. The PGATE voltage generator 714 includes a resistor 762, a resistor 764, a second bias voltage source 766, and a ground 768. The resistor 762 and the resistor 764 are configured as a second voltage divider (e.g., the second voltage divider 219 of FIG. 2). A node 763 is disposed between the resistor 762 and the resistor 764. The node 763 is coupled to the gate of the P-channel transistor 708. The CMOS switch 705, the NGATE voltage generator 712, and the PGATE voltage generator 714 may operate in the same manner as discussed with reference to the CMOS switch 505 of FIG. 5, the NGATE voltage generator 612 of FIG. 6, and the PGATE voltage generator 614 of FIG. 6.

The switch 735 and the switch 737 generate the bulk bias and half vds voltage VB, VB can be express as:

$$VB=(VD+VS)/2.0 \qquad \text{Eq. (9):}$$

It is assumed that the switch 735 and switch 737 are the same. VD is the drain voltage (or the input voltage to the audio switch 702), and VS is the source voltage (or the output voltage of the audio switch 702). The current source 740 and the biasing circuit 746 are constant, and are configured to generate a constant gate to bulk voltage, which can be expressed as:

$$VG-VB=Ig*Zg. \qquad \text{Eq. (10):}$$

Ig is the current source 740 and Zg is the biasing circuit 746. VG is the gate voltage. As a result, the on-resistance of the audio switch 702 is almost constant. As indicated above, the resistor 752, the resistor 754, and the first bias voltage source 756 are used to generate the NGATE voltage, the NGATE voltage can be expressed as:

$$NGATE\ Voltage=(R2*VD+R1*VREFN)/(R1+R2). \qquad \text{Eq. (11):}$$

R2 is the resistor 754. R1 is the resistor 752. The resistor 762, the resistor 764, and the second bias voltage source 766 are used to generate the PGATE voltage, where the PGATE voltage can be expressed as:

$$PGATE\ Voltage=(R4*VD+R3*VREFN)/(R3+R4). \qquad \text{Eq. (12):}$$

R4 is the resistor 764. R3 is the resistor 762. When VD>0, and the P-channel transistor 708 is activated, VD increases and the on-resistance of the P-channel transistor decreases. The PGATE voltage can determine when the P-channel transistor 708 is activated and its sensitivity to VD. Also, it is noted that when the audio switch 702 is closed, VD~=VS. When VD<0 and the N-channel transistor 706 is activated, VD decreases, and the on-resistance of the N-channel transistor 706 decreases. When the load is relatively large (e.g., a small load 748), the absolute value (abs) of the drain-to-source voltage (Vds=(VD−VS)) may be sufficiently large to force the audio switch 702 out of the linear region, and the on-resistance of the audio switch 702 has a positive coefficient of abs(Vds). The on-resistance of the audio switch 702 can be expressed as:

$$R(N0)=R0+a1*abs(Vds)=R0+a1*ratio*abs(VD). \qquad \text{Eq. (13):}$$

The on-resistance of the CMOS switch 705 can be expressed as:

$$Z3=Z0-b1*abs(VD). \qquad \text{Eq. (14):}$$

The CMOS switch 705 has a negative coefficient of abs(VD). The size of the CMOS switch 705, the level of the NGATE voltage, and the PGATE voltage may be tuned to make the overall on-resistance to be N0//Z3 (e.g., the on-resistance of the audio switch 702 in parallel with the on-resistance of the CMOS switch 705), which provides an almost zero coefficient of abs(VD), where:

$$Rtotal=Rt0+O(abs(VD)^2). \qquad \text{Eq. (15):}$$

Figure 8:
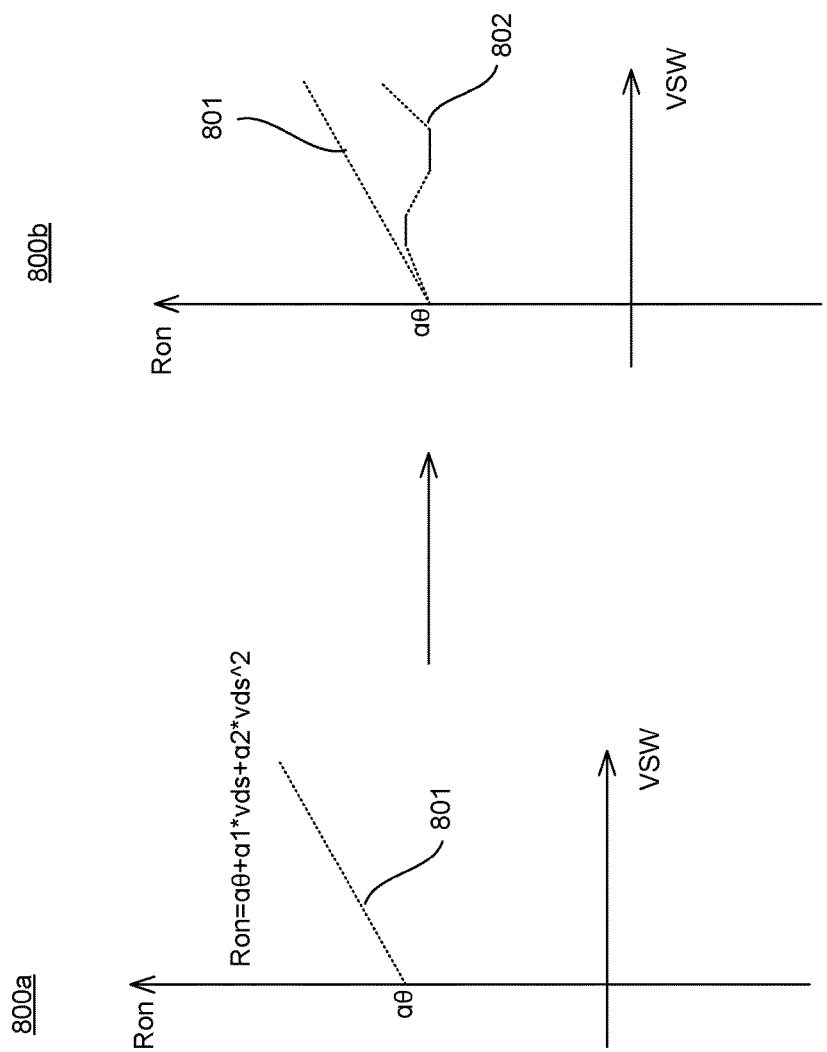
FIG. 8 illustrates a graph depicting on-resistance variation for an audio circuit not having the on-resistance compensation circuit and a graph depicting the on-resistance variation for an audio circuit having the on-resistance compensation circuit according to an implementation.

FIG. 8 illustrates a graph 800a depicting the on-resistance variation of an audio switch as the switch's input voltage increases for an audio circuit that does not include an on-resistance compensation circuit, and a graph 800b depicting the on-resistance variation of the audio switch as the switch's input voltage increases for an audio circuit having the on-resistance compensation circuit. For example, in graph 800a, the changing of the on-resistance is shown by line 801, and the on-resistance increases as the switch's input voltage increases. However, when the on-resistance compensation circuit is added to the audio circuit, the variation of the switch's on-resistance is compensated by the variation of the on-resistance compensation circuit's on-resistance, which can provide a relatively more constant on-resistance as shown by line 802.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An audio switch circuit comprising:
an audio switch configured to selectively couple an input node to an output node to transfer an audio signal across the audio switch, the audio switch having an on-resistance in response to the input node being coupled to the output node, the on-resistance of the audio switch changing by a first value in response to an input voltage of the audio signal increasing from a first level to a second level; and
an on-resistance compensation circuit configured to have an on-resistance that changes by a second value in response to the input voltage of the audio signal increasing from the first level to the second level, the on-resistance compensation circuit being coupled to the audio switch such that the second value at least partially offsets the first value.

2. The audio switch circuit of claim 1, wherein the on-resistance compensation circuit is coupled in parallel with the audio switch.

3. The audio switch circuit of claim 1, wherein the on-resistance compensation circuit is coupled in series with the audio switch.

4. The audio switch circuit of claim 1, wherein the first value is positive and the second value is negative.

5. The audio switch circuit of claim 1, wherein the on-resistance compensation circuit includes a complementary metal-oxide-semiconductor (CMOS) switch, the CMOS switch including a first transistor in parallel with a second transistor.

6. The audio switch circuit of claim 5, wherein the on-resistance compensation circuit includes a first gate voltage generator coupled to a gate of the first transistor, and a second gate voltage generator coupled to a gate of the second transistor.

7. The audio switch circuit of claim 6, wherein the first gate voltage generator includes a first resistor, a second resistor, and a bias voltage source.

8. An audio switch circuit comprising:
an audio switch configured to selectively couple an input node to an output node to transfer an audio signal across the audio switch, the audio switch having an on-resistance in response to the input node being coupled to the output node, the on-resistance of the audio switch increasing in response to an input voltage of the audio signal increasing from a first level to a second level; and
a complementary metal-oxide-semiconductor (CMOS) switch coupled to the audio switch, the CMOS switch configured to have an on-resistance that decreases in response to the input voltage increasing from the first level to the second level, the CMOS switch being coupled to the audio switch such that the increasing of the on-resistance of the audio switch is at least partially offset by the decreasing of the on-resistance of the CMOS switch.

9. The audio switch circuit of claim 8, wherein the CMOS switch is coupled in parallel with the audio switch.

10. The audio switch circuit of claim 8, wherein the CMOS switch is coupled in series with the audio switch.

11. The audio switch circuit of claim 8, wherein the audio switch is a first audio switch, and the CMOS switch is a first CMOS switch, the audio switch circuit further comprising:
a second audio switch; and
a second CMOS switch coupled to the second audio switch, the second CMOS switch configured to compensate a changing of an on-resistance of the second audio switch.

12. The audio switch circuit of claim 8, wherein the CMOS switch including a P-channel transistor in parallel with an N-channel transistor, the audio switch circuit further comprising:
a first gate voltage generator coupled to a gate of the P-channel transistor, the first gate voltage generator configured to generate a first gate voltage based on the input voltage of the audio signal; and
a second gate voltage generator coupled to a gate of the P-channel transistor, the second gate voltage generator configured to generate a second gate voltage based on the input voltage of the audio signal.

13. The audio switch circuit of claim 12, wherein the first gate voltage generator includes a voltage divider and a bias voltage source.

14. The audio switch circuit of claim 12, wherein the second gate voltage generator includes a voltage divider and a bias voltage source.

15. An audio switch circuit comprising:
a first audio switch;
a second audio switch;
an on-resistance compensation circuit coupled to at least one of the first audio switch or the second audio switch, the on-resistance compensation circuit configured to compensate a changing of an on-resistance of at least one of the first audio switch or the second audio switch in response to an input voltage of an audio signal changing from a first level to a second level.

16. The audio switch circuit of claim 15, wherein the on-resistance compensation circuit is coupled to the first audio switch and the second audio switch.

17. The audio switch circuit of claim 15, wherein the on-resistance compensation circuit is coupled in parallel to the first audio switch, and the on-resistance compensation circuit is coupled in parallel to the second audio switch.

18. The audio switch circuit of claim 15, wherein the on-resistance compensation circuit is a first on-resistance compensation circuit, the first on-resistance compensation circuit being coupled to the first audio switch, the audio switch circuit further comprising:
a second on-resistance compensation circuit coupled to the second audio switch.

19. The audio switch circuit of claim 15, wherein the on-resistance compensation circuit includes a complementary metal-oxide-semiconductor (CMOS) switch, the CMOS switch including a first transistor in parallel with a second transistor.

20. The audio switch circuit of claim 19, wherein the on-resistance compensation circuit includes a first gate voltage generator coupled to a gate of the first transistor, and a second gate voltage generator coupled to a gate of the second transistor.

* * * * *